(12) United States Patent
Im et al.

(10) Patent No.: US 12,157,185 B2
(45) Date of Patent: Dec. 3, 2024

(54) SYSTEMS AND METHODS FOR SPOT BEAM AND LINE BEAM CRYSTALLIZATION

(71) Applicant: The Trustees of Columbia University in the City of New York, New York, NY (US)

(72) Inventors: James S. Im, New York, NY (US); Wenkai Pan, New York, NY (US); Ruobing Song, New York, NY (US); Insung Choi, Busan (KR); Vernon Wong, Mountain View, CA (US)

(73) Assignee: The Trustees of Columbia University in the City of New York, New York, NY (US)

( * ) Notice: Subject to any disclaimer, the term of this patent is extended or adjusted under 35 U.S.C. 154(b) by 747 days.

(21) Appl. No.: 16/755,419

(22) PCT Filed: Oct. 15, 2018

(86) PCT No.: PCT/US2018/055846
§ 371 (c)(1),
(2) Date: Apr. 10, 2020

(87) PCT Pub. No.: WO2019/075454
PCT Pub. Date: Apr. 18, 2019

(65) Prior Publication Data
US 2020/0238441 A1  Jul. 30, 2020

Related U.S. Application Data

(60) Provisional application No. 62/718,483, filed on Aug. 14, 2018, provisional application No. 62/571,872, filed on Oct. 13, 2017.

(51) Int. Cl.
*B23K 26/06* (2014.01)
*B23K 26/0622* (2014.01)
(Continued)

(52) U.S. Cl.
CPC ........ *B23K 26/355* (2018.08); *B23K 26/0622* (2015.10); *B23K 26/066* (2015.10); *B23K 26/0821* (2015.10)

(58) Field of Classification Search
CPC .................. B23K 26/355; B23K 26/0622; B23K 26/066; B23K 26/0821
(Continued)

(56) References Cited

U.S. PATENT DOCUMENTS 5,815,494 A    9/1998  Yamazaki et al.
6,193,796 B1   2/2001  Yang
(Continued)

FOREIGN PATENT DOCUMENTS

JP    8-097141        4/1996
JP    10223554 A  *  8/1998
(Continued)

OTHER PUBLICATIONS

Machine translation of Japan Patent document No. 10-223,554-A, Aug. 2023 (Year: 2023).*

(Continued)

*Primary Examiner* — Geoffrey S Evans
(74) *Attorney, Agent, or Firm* — Wilmer Cutler Pickering Hale and Dorr LLP

(57) ABSTRACT

Methods and systems for crystallizing a thin film provide an optics system configured to produce a laser spot beam directed towards the thin film and truncate the laser spot beam before the laser spot beam comes into contact with the thin film. The truncated laser spot beam is continually translated in a first direction while irradiating an amorphous silicon area of the thin film to generate a molten zone in the irradiated amorphous silicon area, where the thin film cools and solidifies to form crystal grains.

20 Claims, 13 Drawing Sheets

(51) Int. Cl.
*B23K 26/066* (2014.01)
*B23K 26/082* (2014.01)
*B23K 26/352* (2014.01)

(58) Field of Classification Search
USPC ............ 219/121.69, 121.68, 121.71, 121.76, 219/121.85
See application file for complete search history.

(56) References Cited

U.S. PATENT DOCUMENTS

| | | | |
|---|---|---|---|
| 6,555,449 | B1 | 4/2003 | Im et al. |
| 6,558,991 | B2 | 5/2003 | Yamazaki et al. |
| 6,809,013 | B2 | 10/2004 | Ito |
| 6,961,361 | B1 | 11/2005 | Tanaka |
| 7,172,841 | B2 | 2/2007 | Taniguchi et al. |
| 7,294,589 | B2 | 11/2007 | Tanaka |
| 7,772,523 | B2 | 8/2010 | Tanaka et al. |
| 7,790,533 | B2 | 9/2010 | Tanaka et al. |
| 7,879,742 | B2 | 2/2011 | Tanaka |
| 7,964,453 | B2 | 6/2011 | Doudoumopoulos et al. |
| 8,014,427 | B1* | 9/2011 | Anikitchev ........ B23K 26/0738 372/9 |
| 8,173,977 | B2 | 5/2012 | Tanaka |
| 8,395,084 | B2 | 3/2013 | Tanaka |
| 8,440,581 | B2* | 5/2013 | Im .................. H01L 21/268 438/150 |
| 8,525,075 | B2 | 9/2013 | Tanaka |
| 9,099,390 | B2 | 8/2015 | Kim |
| 10,290,743 | B2 | 6/2019 | Liu |
| 11,306,392 | B2 | 4/2022 | Shuto |
| 2002/0160586 | A1 | 10/2002 | Wada et al. |
| 2005/0189542 | A1 | 9/2005 | Kudo et al. |
| 2005/0237895 | A1 | 10/2005 | Tanaka et al. |
| 2006/0194354 | A1 | 8/2006 | Okumura |
| 2006/0254500 | A1 | 11/2006 | Im et al. |
| 2007/0212860 | A1 | 9/2007 | Fujino et al. |
| 2007/0243698 | A1 | 10/2007 | Chao et al. |
| 2008/0210945 | A1 | 9/2008 | Miyairi |
| 2010/0301339 | A1 | 12/2010 | Morimura et al. |
| 2012/0309140 | A1 | 12/2012 | Oda et al. |
| 2013/0105807 | A1 | 5/2013 | Im et al. |
| 2013/0161312 | A1* | 6/2013 | Im .................. H01L 21/268 219/385 |
| 2014/0361414 | A1* | 12/2014 | Im ........................ G21K 5/10 250/492.2 |
| 2015/0017793 | A1 | 1/2015 | Hallam et al. |
| 2015/0076504 | A1 | 3/2015 | Im |
| 2015/0177525 | A1 | 6/2015 | Shudo |
| 2016/0013057 | A1* | 1/2016 | Avdokhin ......... H01L 21/02686 372/6 |
| 2016/0293414 | A1* | 10/2016 | Adams ............... H01L 21/02521 |
| 2017/0351027 | A1 | 12/2017 | Reano |
| 2017/0358449 | A1* | 12/2017 | So ..................... H01L 21/67115 |
| 2018/0356706 | A1 | 12/2018 | Acef |
| 2019/0027363 | A1 | 1/2019 | Im et al. |

FOREIGN PATENT DOCUMENTS

| | | | |
|---|---|---|---|
| JP | 2004260144 A | * 9/2004 | |
| JP | 2007115841 A | * 5/2007 | |
| WO | WO-2011065992 | 6/2011 | |
| WO | WO-2011065992 A1 | * 6/2011 | ......... B23K 26/0081 |
| WO | WO-2011152854 | 12/2011 | |
| WO | WO-2017004280 A1 | * 1/2017 | ....... H01L 21/02068 |
| WO | WO-2017120584 A1 | 7/2017 | |
| WO | WO-2019075454 | 4/2019 | |

OTHER PUBLICATIONS

Machine translation of Japan Patent document No. 2004-260,144-A, Aug. 2023 (Year: 2023).*
Machine translation of Japan Patent document No. 2007-115,841-A, Aug. 2023 (Year: 2023).*
International Search Report and Written Opinion issued by the U.S. Patent and Trademark Office as International Searching Authority in International Application No. PCT/US17/12716, dated May 15, 2017 (18 pages).
International Search Report and Written Opinion issued by the U.S. Patent and Trademark Office as International Searching Authority in International Application No. PCT/US18/55846, dated Dec. 27, 2018 (24 pages).
"The EM Spectrum", University of Tennessee, Physics Department, http://labman.phys.utk.edu/phys222core/modules/m6/The%20EM%20spectrum.html, May 6, 2020 (3 pages).
Bo, et al., "Nanojoint Formation between Ceramic Titanate Nanowires and Spot Melting of Metal Nanowires with Electron Beam", ACS Applied Materials & Interfaces, 9(10): 9143-9151, Feb. 17, 2017 (9 pages).
Chen, et al., "Laser annealing process of ITO thin films using beam shaping technology", Optics and Lasers in Engineering, 50(3):491-495, Mar. 2012, available online Nov. 12, 2011 (5 pages).
Gu, et al., "Pulsed laser deposition of NiTi shape memory alloy thin films with optimum parameters", Thin Solid Films, 330(2): 196-201, Sep. 30, 1998 (6 pages).
Kang, et al., "Fabrication of high performance thin-film transistors via pressure-induced nucleation", DOI: 10.1038/srep06858, Scientific Reports, vol. 4, Article 6858, published Oct. 31, 2014 (6 pages).
Pan, et al., "P-184: Numerical Analysis QCW-Laser-Based Spot-Beam Crystallization of Si Films", SID Symposium Digest of Technical Papers, pp. 1963-1966, Jun. 2017 (4 pages).
Ryu, et al., "Large area crystallization of amorphous Si with overlapping high repetition rate laser pulses", Thin Solid Films, 520(22): 6724-6729, published online Jul. 22, 2012 (6 pages).
Zhao, et al., "Hardness and free vol. distributions of Zr-based alloys spot treated by laser beam", Journal of Non-Crystalline Solids, 358(23):3318-3321, published online Oct. 4, 2012 (4 pages).

* cited by examiner

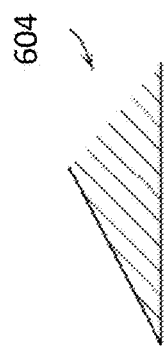
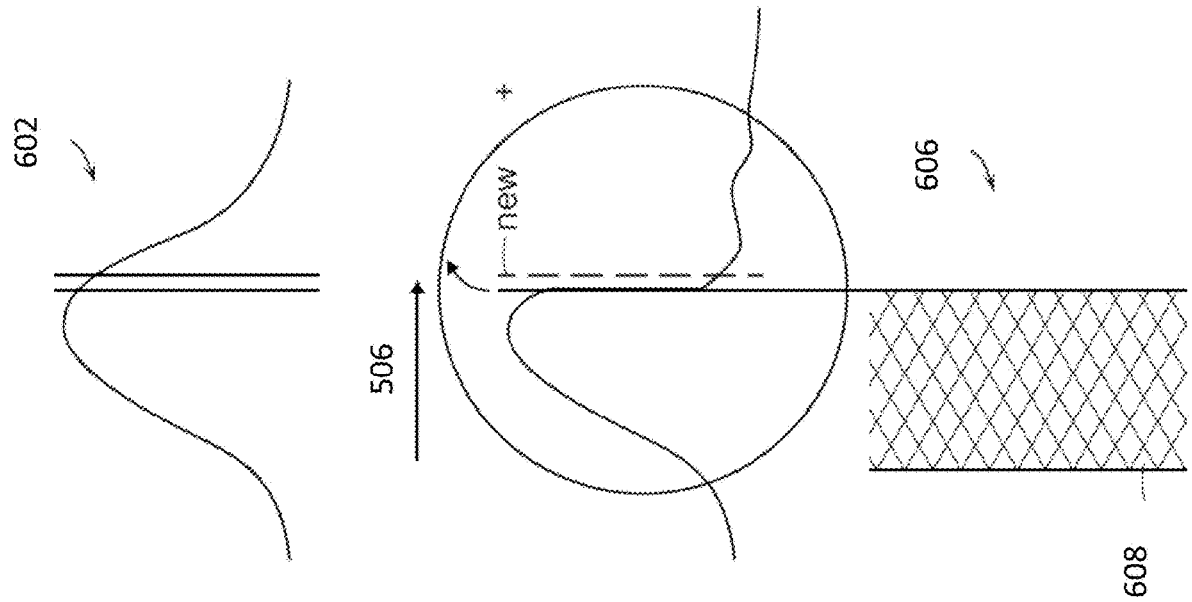
FIG. 6A
FIG. 6B
FIG. 6C

SYSTEMS AND METHODS FOR SPOT BEAM AND LINE BEAM CRYSTALLIZATION

CROSS-REFERENCE TO RELATED APPLICATIONS

This application is a National Stage Entry of International Patent Application No. PCT/US2018/055846, filed on Oct. 15, 2018, which claims priority under 35 U.S.C. § 119(e) to U.S. Provisional Patent Application No. 62/718,483 filed on Aug. 14, 2018, entitled "TECHNIQUES FOR THIN FILM CRYSTALLIZATION USING TRUNCATED LASER BEAM," and to U.S. Provisional Patent Application No. 62/571,872 filed on Oct. 13, 2017, entitled "TECHNIQUES FOR OPTIMIZING SPOT BEAM CRYSTALLIZATION," the contents of each of which are hereby incorporated in their entirety by reference.

This application is also related to International Patent Application No. PCT/US2017/012716, filed on Jan. 9, 2017, and published on Jul. 13, 2017, as International Patent Publication No. WO/2017/120584, entitled "Methods and Systems for Spot Beam Crystallization," the contents of which are hereby incorporated in their entirety by reference.

FIELD OF THE INVENTION

This invention relates to methods and systems for spot beam and line beam crystallization, and particularly, to techniques for optimizing spot beam crystallization.

BACKGROUND

Films, for example, silicon films, can be processed using laser-controlled irradiation and melting of the film. The laser-controlled melting can create selected crystalline structures in the film. Prior methods of laser crystallization include Sequential Lateral Solidification ("SLS") and Excimer Laser Annealing ("ELA"). Both methods rely on one complete cycle of melting-and-solidification before continuing the processing of the film, for example, before the next pulse or series of pulses irradiates the film, the previously irradiated region of the film undergoes an entire melting and solidification cycle and becomes fully solidified. Further, these methods can produce films with relatively uniform grain sizes of about 0.3 to 3.0 microns, which are sufficient for displays and mobile devices, which are around 300 to 500 pixels per inch.

Next generation devices, including devices used for virtual reality viewing, require far higher pixels per inch, e.g., on the order of thousands of pixels per inch, to produce quality images. This requires crystallized films with better uniformity than can be achieved using a long line-beam utilized in the prior ELA and SLS methods. Further, the prior processes involve expensive equipment with high laser maintenance and operating costs and are not efficient.

SUMMARY

The present disclosure relates to methods and systems for spot beam crystallization technique where a small laser beam spot is continually advanced across a film to create a sustained complete or partial molten zone that is translated across the film and crystallizes to form uniform polycrystalline structures or grains.

According to aspects of the disclosure, a disclosed method for crystallizing a thin film, can include the steps of providing a thin film and an optics system configured to produce a laser spot beam directed towards the thin film and truncating the laser spot beam before the laser spot beam comes into contact with the thin film. The disclosed method can also include the step of continually translating the truncated laser beam in a first direction while irradiating an amorphous silicon area of the thin film to generate a molten zone in the irradiated amorphous silicon area and allowing the irradiated amorphous silicon area to cool and solidify.

According to aspects of the disclosure, the step of truncating the laser spot beam can include providing a proximity mask that substantially reduces the energy density of the laser spot beam, wherein the proximity mask can comprise, for example, one of a knife-edge or a slit.

According to aspects of the disclosure, truncating the laser spot beam can result in blocking a portion of the laser spot beam with energy density values around a crystallization threshold value of amorphous silicon.

According to aspects of the disclosure, truncating the laser spot beam can include providing a projection mask and projection optics that block a portion of the laser spot beam with energy density values around a crystallization threshold value of amorphous silicon.

According to aspects of the disclosure, the optics system can include one of a constant frequency laser, a continuous-wave solid-state laser, a quasi-continuous wave solid-state laser, a pulsed laser, and a fiber laser, and a wavelength of the laser can be in the UV spectrum or the visible spectrum.

According to aspects of the disclosure, an energy density profile of the laser spot beam in at least one direction is a Gaussian profile and truncating the laser spot beam results in eliminating a front tail end of the Gaussian profile.

According to aspects of the disclosure, the optics system comprises a laser configured to direct a beam towards a rotating scanning mirror to generate a reflected beam towards the thin film.

According to aspects of the disclosure, the optics system can include two lasers and can combine an output of the two lasers to produce the laser spot beam. According to aspects of the disclosure two lasers are combined to simultaneously fire shots or sequentially fire shots, wherein the sequentially firing results in partially overlapping shots or fully separated shots According to aspects of the disclosure, the optics system can include four lasers and can combine outputs of a first laser and a second laser to produce the laser spot beam for irradiating a first region of the thin film and can further combine outputs of a third laser and a fourth laser to produce a second laser spot beam for irradiating a second region of the thin film. The optics system can alternate between combining outputs of the first laser and the second laser to produce the laser spot beam for irradiating a first region of the thin film and combining outputs of the third laser and the fourth laser to produce a second laser spot beam for irradiating a second region of the thin film, the second region neighboring the first region.

According to aspects of the disclosure, a method for crystallizing a thin film can include the steps of providing a thin film, reflecting a laser beam towards a scanning mirror having a first number of facets to produce a laser spot beam directed towards the thin film, and determining a rotating speed of the scanning mirror and a distance between two consecutive beam spot locations, such that the product of the first number of facets and the distance between two consecutive beam spot locations corresponds to the a pixel distance.

According to aspects of the disclosure, the method can also include the steps of continually translating the truncated laser beam in a first direction while irradiating an amorphous silicon area of the thin film to generate a molten zone in the irradiated amorphous silicon area, and allowing the irradiated amorphous silicon area to cool and solidify and form grains.

According to aspects of the disclosure, a method for crystallizing a thin film can include the steps of providing a thin film and an optics system configured to produce a laser line beam in the visible spectrum with a gaussian-line profile, the laser line beam directed towards the thin film. The method can also include the steps of truncating the laser line beam before the laser spot beam comes into contact with the thin film to block a portion of the line beam such that the front edge of the energy density is substantially reduced and does not result in crystallization of amorphous silicon with energy density around the crystallization threshold, irradiating an amorphous silicon area of the thin film to generate a molten zone in the irradiated amorphous silicon area, and allowing the irradiated amorphous silicon area to cool and solidify. According to aspects of the disclosure, the laser can be a green laser or a blue laser.

According to aspects of the disclosure, a system for crystallizing a thin film can include a computer-controlled stage configured to hold a thin film, an optics system configured to produce a laser spot beam directed towards the thin film, and continually translate a truncated laser spot beam in a first direction while irradiating an amorphous silicon area of the thin film to generate a molten zone in the irradiated amorphous silicon area, and a mask configured to truncate the laser spot beam before the laser spot beam comes into contact with the thin film.

BRIEF DESCRIPTION OF THE DRAWINGS

Various objects, features, and advantages of the present invention can be more fully appreciated with reference to the following detailed description of the invention when considered in connection with the following drawing, in which like reference numerals identify like elements. The following drawings are for illustration purposes only and are not intended to be limiting of the invention.

FIGS. 6A-6E illustrate an exemplary method for spot beam crystallization, according to aspects of the disclosure.

DETAILED DESCRIPTION

Figure 1:
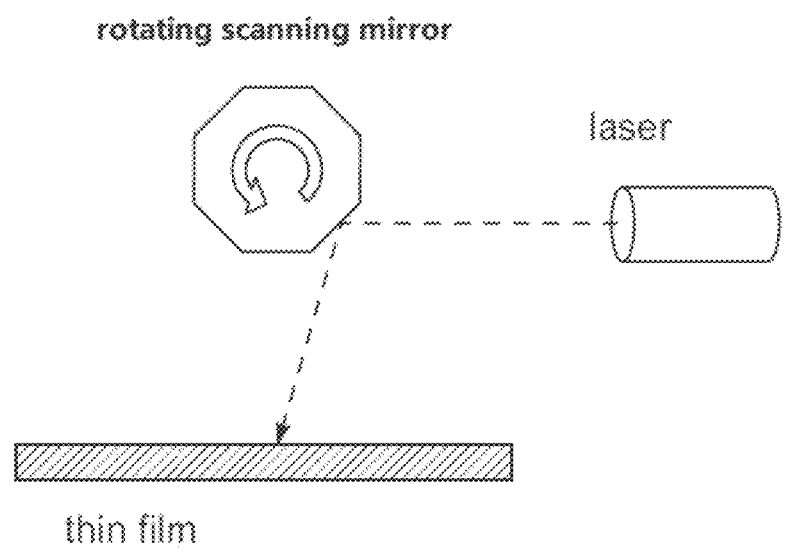
FIG. 1 illustrates an exemplary system for spot beam crystallization, according to aspects of the disclosure.

Systems for Spot Beam Crystallization ("SBC") have been proposed to address shortcomings of prior art crystallization techniques. The disclosed systems and methods provide techniques for optimizing spot beam crystallization. In the SBC technique, a small laser beam spot is continually advanced across a film to create a sustained molten zone that is translated across the film, which eventually crystallizes to form uniform, large- or small-grained crystalline structures or grains. The SBC can mimic obtaining a line beam by having the spot scanned right into one direction. The spot beam location can be obtained using a rotating polygon, for example as shown in FIG. 1, where the beam hits the polygon, and as the polygon rotates, the beam can sweep from one position on the film to another. FIG. 1 shows a polygon with 8 facets; however, different polygons can be used, e.g., polygons with less or more facets.

Figure 2:
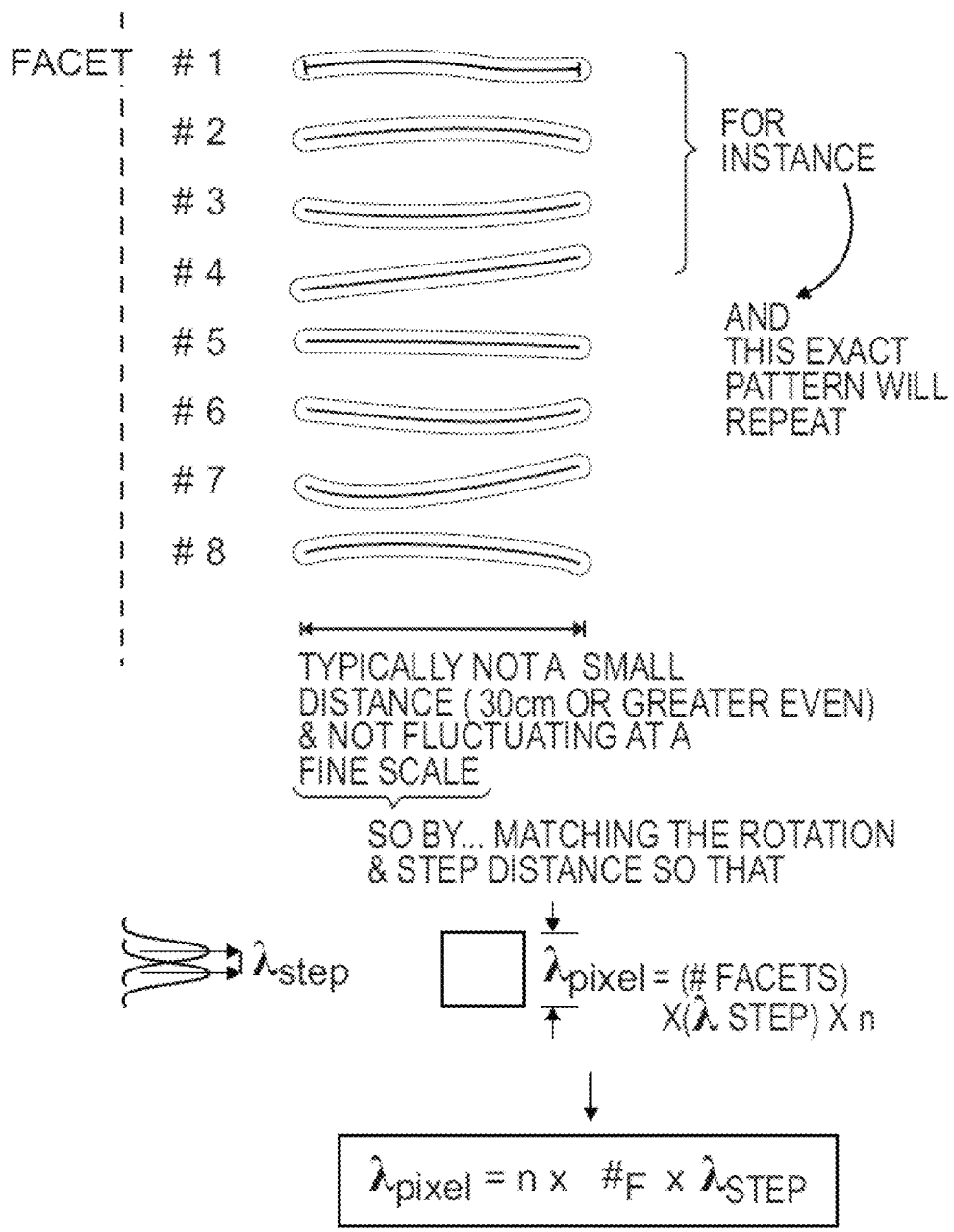
FIG. 2 illustrates an exemplary method for creating pixels with similar non-uniformities, according to aspects of the disclosure.

FIG. 2 shows that the facets of the polygon may not be identical, e.g., the facets are not perfectly straight or planar, which can cause non-uniformities, as the different facets guide the bean onto the film. According to aspects of the disclosure, these non-uniformities are controlled within a pixel. A person of ordinary skill would understand that these non-uniformities are periodic. For example, in the case of a polygon with eight facets, after a full rotation of the polygon, e.g., the laser beam has hit all eight facets, the process repeats. According to aspects of the disclosure, this periodicity is matched in a way such that the width of the pixel corresponds to one or more complete rotations of the polygon. For example, this constraint can be satisfied when the following equation is true:

$$\lambda_{pixel} = \lambda_{step} \times (\# \text{ of facets}) \times n.$$

In the above equation, $\lambda_{pixel}$ is the pixel distance, $\lambda_{step}$ is the distance between two consecutive beam spot locations, and "n" is an integer number. If "n" equals 1, this means that the entire pixel distance is traveled with one complete polygon rotation. This method can repeat the non-uniformities arising from the imperfections of a given polygon. Accordingly, each pixel can have similar non-uniformities, and therefore, this method will result in a uniform display, e.g., each pixel of the display will be similar.

In an Excimer Laser Annealing (ELA) process, the step distance and the shot number are inflexibly linked. For example, in ELA, a 400 μm beam can result from a 40-shot ELA process with a 10 μm step (e.g., a high shot number and small step distance) or 20-shot process with a 20 μm step. The 40-shot ELA process with a 10 μm step can produce a better film than the 20-shot process with a 20 μm step. However, a 40-shots ELA process is slow and expensive. In some instances, even a 6-shot ELA process can result in a "good-enough" material.

Figure 3:
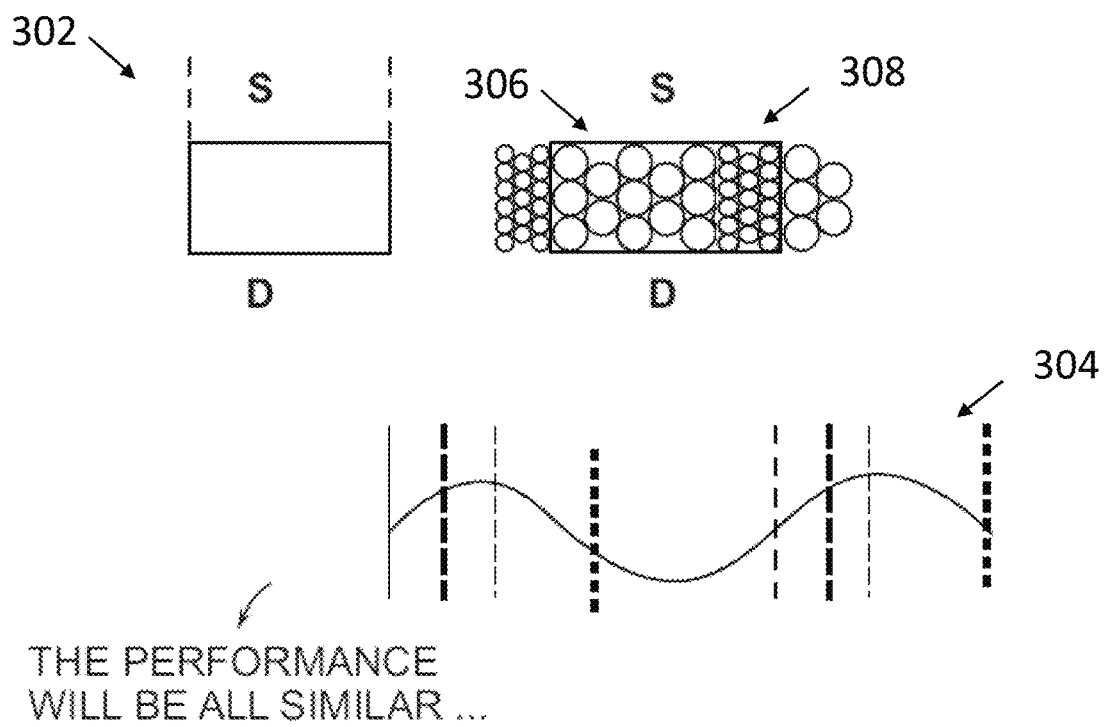
FIG. 3 illustrates an exemplary method for matching non-uniformities to the device dimensions, according to aspects of the disclosure.

According to aspects of the disclosure, before performing an ELA step, a SBC step can be performed, e.g., using a green laser, to provide pre-crystallization of the amorphous thin film. The subsequent ELA step can then be performed with a reduced shot number compared to an ELA step without the SBC pre-crystallization step. The SBC pre-crystallization step combined with the ELA step can result in higher yield compared to the yield from a stand-alone ELA step. When combined with an ELA step, the SBC pre-crystallization step is not intended to obtain the final material. Rather, it can be used for crystallizing the film such that small grains are created with possible non-uniformities but very small periods, which can be matched to the device dimensions. This is shown in FIG. 3, which illustrates an exemplary method for matching non-uniformities to the device dimensions. Specifically, FIG. 3 shows how to create devices, e.g., transistors 302, with similar performance by repeating the periodic non-uniformities (304). For example, there can be a large grain region (306) followed by a small grain region (308), which can be repeated by a large grain region and another small grain region. This can result in similar devices, as long as the periodicity is matched to the device, e.g., the same large/small grain regions are between the source and drains of the transistors.

According to aspects of the disclosure, the pre-crystallization step can be performed with a small step and small overlap between consecutive beams. This can result in having most of the energy of the beam hit the amorphous side of the thin film, where there is high absorption of the laser energy. This results in reduced wasted energy. The small step and small overlap step can be accomplished by using thin beam laser, e.g., 5-10 μm, while the step can be 1-2 μm.

The SBC pre-crystallization step was discussed above in connection with a subsequent ELA step. However, a person of ordinary skill would understand that different combinations of a first pre-crystallization step and a second irradiation step are possible, e.g., a green laser SBC pre-crystallization step and an ELA step, an ultra-violet laser SBC pre-crystallization step and an ELA step (which can alternatively only include a single ultra-violet laser SBC crystallization step), a green laser SBC pre-crystallization step and an ultra-violet laser SBC crystallization step, or a first ultra-violet laser SBC pre-crystallization step and a second ultra-violet laser SBC crystallization step.

A person of ordinary skill would understand that a lateral melting, e.g., melting from a grain boundary that extends the thickness of the thin film propagating in both x and y dimensions of the thin film, is desired, because it can result in better crystallized thin films after solidification. However, SBC can sometimes result in superheating of the thin film surface. Every time a beam hits the surface, the temperature of the surface, e.g., the local region where the beam heats the thin film, will increase rapidly, e.g., there can be a temperature spike, and then the temperature will decrease after the beam, until the subsequent beam hits the surface. In some cases, the surface can get heated enough that the surface of thin film starts melting. This can result in a one-dimensional melting where the thin film melts at the surface and the melting propagates throughout the thickness of the film. This will reduce lateral melting, which is undesired, because with surface melting, energy can be wasted for heat effusion on places it does not matter.

According to aspects of the disclosure, a way to avoid high spiking is to have higher frequency lasers with lower pulse energy. The pulse energy can be easily reduced through beam expansion. Higher frequency can be the parameter to pursue. For example, two lasers can be combined, or one laser can go through extra reflection and then partial reflection and then get combined again to increase the effective frequency. According to aspects of the disclosure the laser frequency can be above 300 MHz or more preferably above 500 Mhz. Given the power of the laser is fixed, having higher frequency will result in reduced energy per pulse.

Figure 4:
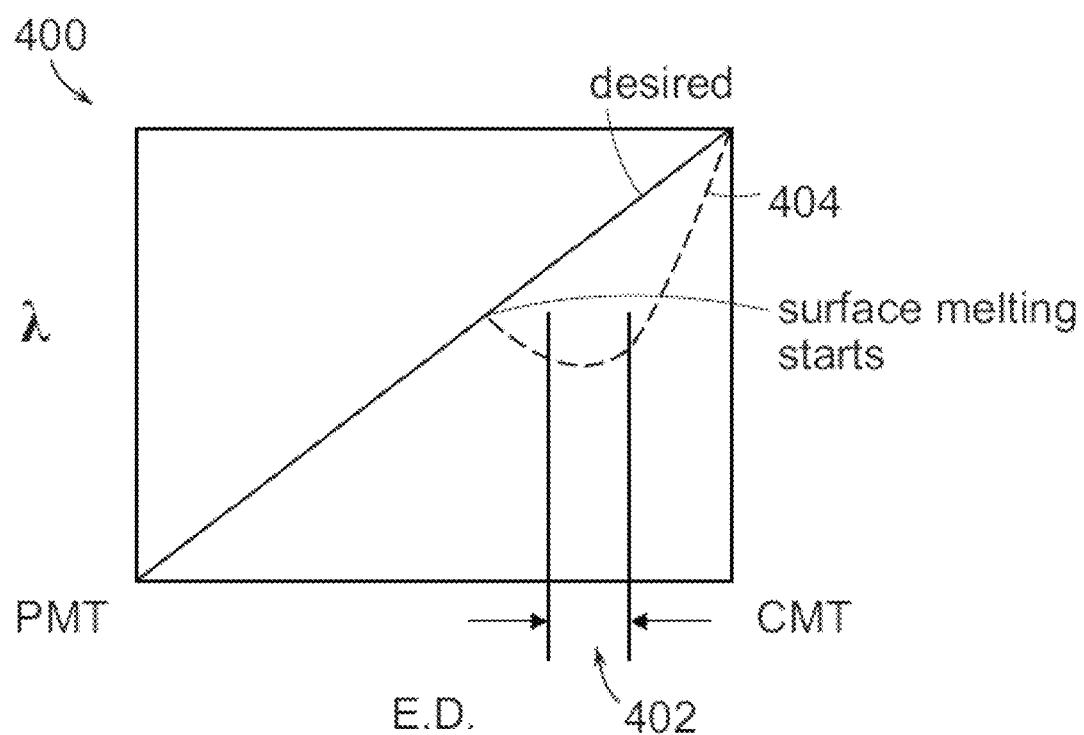
FIG. 4 illustrates exemplary process for spot beam crystallization for different energy density values, according to aspects of the disclosure.

FIG. 4 explains generally at 400 surface melting. As the energy density (E.D.) of the laser increases, the thin film can exhibit partial melting (PMT) until it melts completely (CMT), where λ corresponds to the distance between two grain boundaries, and shows the percentage of the area that has melted. If the temperature spikes with every beam are kept relatively low, surface melting can be avoided, and the lateral melting will follow the solid line. If no surface melting has occurred, the desired operation as indicated in FIG. 4, will have sufficiently high energy density so that pretty substantial melting takes place because melting is what leads to evolution of the structure. Energy density that is very close to or at complete melting is avoided because then a chunk of the thin film area can melt completely, and nucleation can appear, which is undesirable.

According to aspects of the disclosure, if surface melting has occurred, e.g., it cannot be avoided as discussed above, the method of operation is selected such that the non-uniformities are reduced. This can be accomplished by choosing to operate at a process window 402 where the size of the grains will not vary significantly, e.g., the slope of the curve is almost flat, because it is good for making relatively uniform crystallization regions. For example, operating outside process window 402, can lead to high variations with small energy density variations, e.g., the curve is steep so even small variations in the energy density, will lead to operation in significantly varying conditions. Some regions can get irradiated with high energy pulses, because of laser variations, e.g., spatial variations of the beam profile. Because of these high energy pulses, slight fluctuation outside of process window 402 can lead to large grain material and smaller grain material. The slope of curve 404 at the process energy density determines how nonuniform the material will be.

As discussed above, spot beam crystallization is a technique for processing films, for example, silicon films, using laser-controlled irradiation and melting of the film. The laser-controlled melting can create selected crystalline structures in the film. In spot beam crystallization, a small laser beam spot is continually advanced across a film, where successive overlapping high frequency beam spots create a sustained complete or partial molten zone that is translated across the film and crystallizes to form uniform polycrystalline structures or grains. Because these grains can be sized to a micron or less than 0.3 micron, and are highly regular, displays having 3,000 to 5,000 subpixels per inch can be created from these films. Further, spot beam crystallization can produce these small, uniform grained films with high throughput and efficiency. Spot beam crystallization techniques can utilize efficient and inexpensive lasers with low operating costs to create the same or better materials at higher throughputs and lower costs, than conventional Excimer-laser-based line-beam techniques. These lasers can have a very high frequency and very low pulse energy, such as, single-mode, quasi-continuous wave (QCW) fiber or other solid-state lasers. Sequential lateral solidification can be done by inducing complete melting of irradiated amorphous silicon by increasing the incident energy density, for example, above the complete melting threshold.

Conventional spot beam crystallization that uses ultraviolet ("UV") fiber lasers currently provides acceptable polycrystalline structures, but the UV laser should further improve to provide more power, enhanced laser stability, lower operating costs, and longer frequency-conversion-crystal lifetime. Another spot beam crystallization technique using a spot beam scanner, for example, using a polygon scanner as discussed above can generate positional fluctuations in the crystalized region when scanning extends the length across the films, e.g., the edge of the crystalized region may not be straight.

Figure 5A:
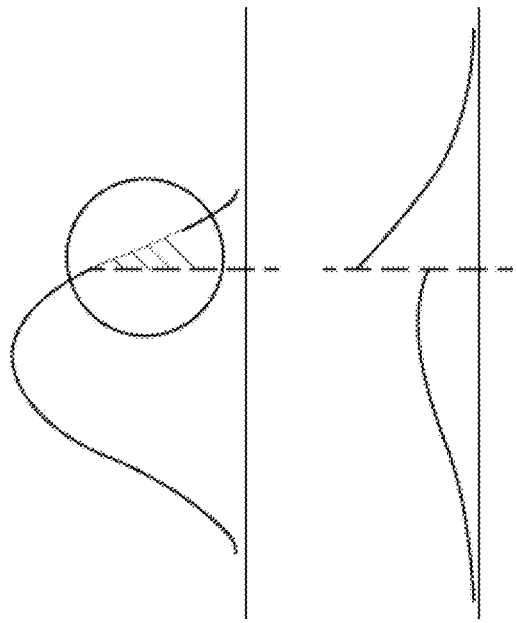
FIGS. 5A-5B illustrate an exemplary method for spot beam crystallization, according to aspects of the disclosure.
Figure 5A:
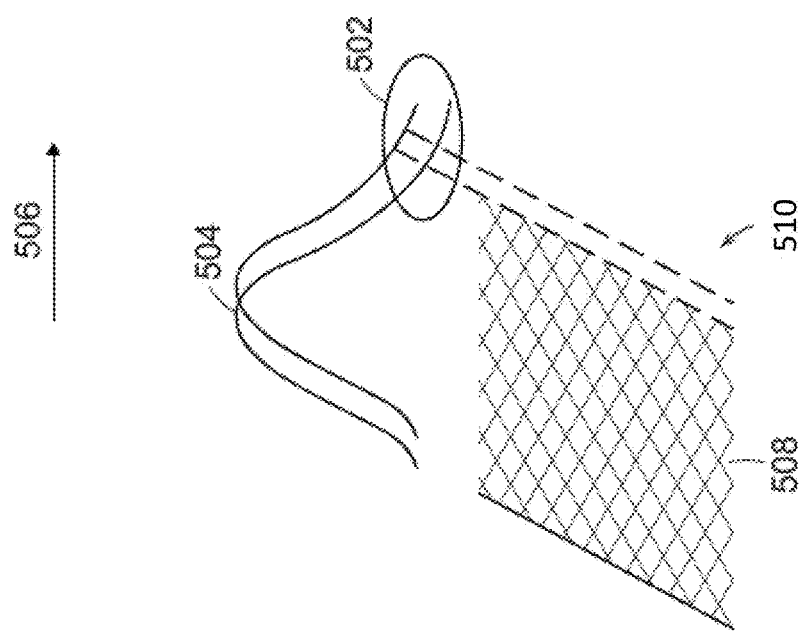
Figure 5B:
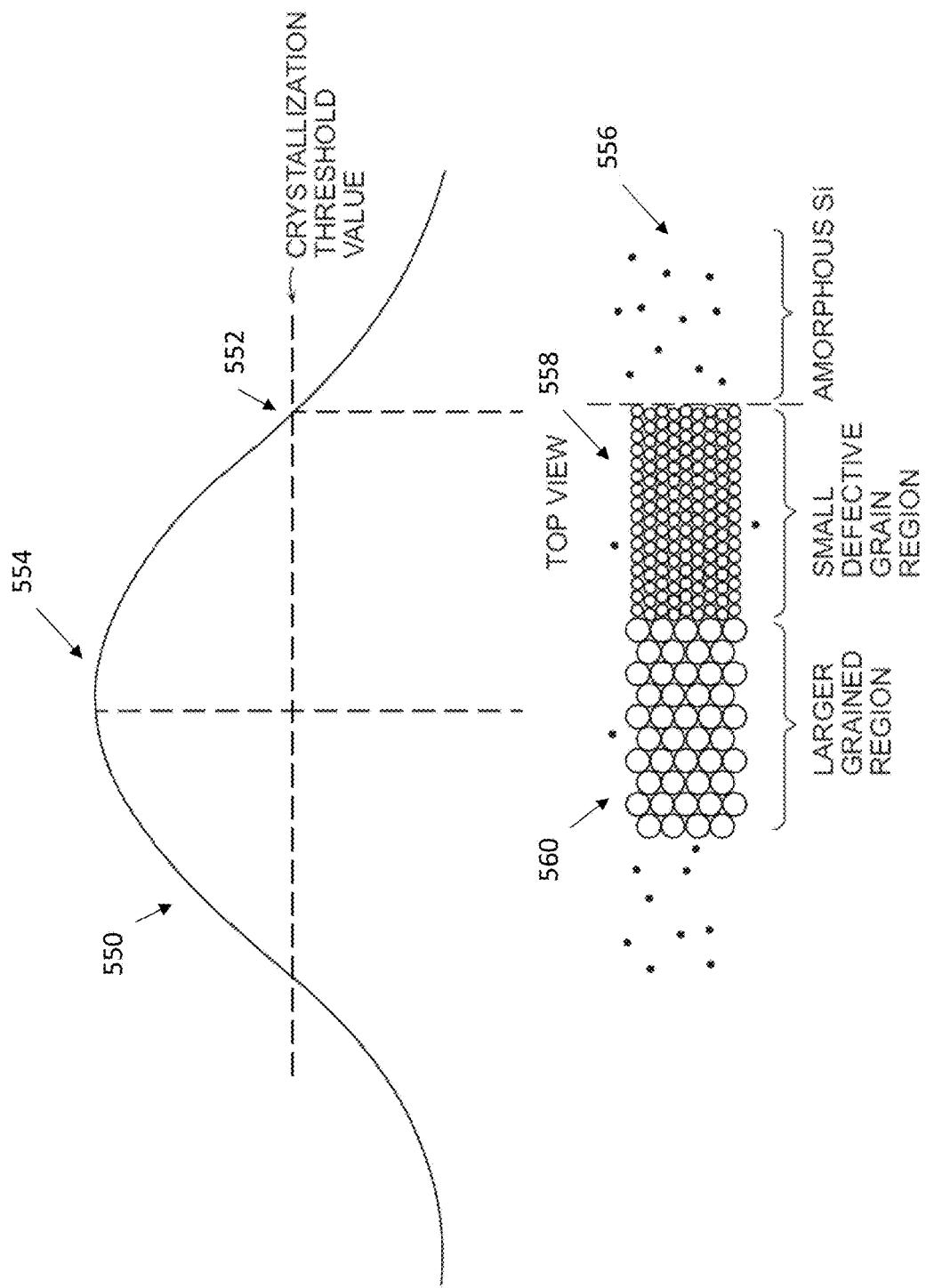

Green lasers, such as, green quasi continuous-wave fiber lasers, have substantially better characteristics, for example, are more powerful, more stable, have lower operation cost, as the frequency-conversion-crystals have a very long lifetime of operation. Because of these characteristics, green lasers have become an attractive option of spot beam crystallization. Research and development on green lasers has been significant; however, it has not resulted yet in a successful solution in providing effective crystallization. One of the reasons relates to the absorption coefficient of green light. Specifically, the absorption coefficient of green light for crystal silicon is very low. Whereas, the absorption coefficient for amorphous silicon is much higher than for crystal silicon. And this difference in absorption, for example, for typically used 50-nm-thin Si films, is responsible for bad crystallization results, because, for example, with gaussian beams, the front tail, e.g., front edge, of the gaussian waveform can crystallize amorphous silicon. This is illustrated in FIG. 5A. The front tail of the gaussian waveform (504) can result in crystallization in region 510 at the lowest possible threshold (502), for example, corresponding to the minimum energy density required for crystallization. This results in the formation of extremely small grained silicon, which is obtained at and near the threshold energy density and is not suitable for making good devices over an extended area. This also results in wasted energy because as the beam moves across the scanning direction (506), the peak energy density of the beam will irradiate an already-crystallized or pre-crystallized region. And since the region is no longer amorphous, the absorption of the laser energy will be very low, and therefore most of the energy of the laser beam would be wasted. FIG. 5B similarly illustrates the undesirable effect of crystalizing amorphous silicon at the non-optimal energy density level. Specifically, FIG. 5B shows the effect of an incident spot beam on a silicon film. If the energy density (550) of the beam is below the crystallization threshold value (552), the beam does not crystalize the amorphous silicon (556). If the energy density is above the crystallization threshold value (552), but not at the optimum (or near maximum) value for crystallization (554), an amorphous silicon area can be crystallized (558), but the resulting grains will be small and/or defective. If on the other hand, the energy density of the beam is at the optimum (or near maximum) value for crystallization (554), an amorphous silicon area will crystallize with large grains (560).

The disclosed systems and methods can use green or blue wavelength fiber lasers in spot beam crystallization techniques in efficient ways, for example to avoid low energy density crystallization of amorphous silicon, and spatially controlled crystallization of amorphous silicon.

The disclosed systems and methods can also utilize a line beam in the visible spectrum, instead of a spot beam to irradiate an amorphous silicon area of the film. According to aspects of the disclosure, the line beam can have a gaussian-type profile, wherein truncating the line beam involves blocking a portion of the line beam such that the front edge of the energy density is substantially reduced and does not result in crystallization of amorphous silicon with energy density around the crystallization threshold. Instead, the amorphous silicon is irradiated with the portion of the line beam that has high energy density to produce long grains after crystallization.

According to aspects of the disclosure, the disclosed systems and methods use a shaped beam, for example, a sharply truncated spot beam by using a knife-edge-type mask, for example, a proximity or projection-type mask, to remove a side of the beam. This is illustrated in FIG. 6A, which shows a gaussian-shaped green laser beam (602) and a knife edge (604) that can be used as a mask to remove the front edge of the gaussian waveform. This can result in a shaped beam as shown in FIG. 6B. As shown, the peak energy density of the beam irradiates amorphous silicon as the beam moves towards the scanning direction, because the front end of the beam has no or very little energy density, such that it cannot crystallize the amorphous silicon. Accordingly, the knife edge, which can be controlled very precisely can effectively result in a very thin and well-defined beam, as the previously precisely crystallized region doesn't absorb enough energy to change its grain structure substantially. Therefore, the newly crystallized area does not entirely depend on the size, shape, and location of scanned beam, but is mostly defined by the relative-to-sample positioning of the knife edge, because the truncated laser beam can be incident to a very well-defined (even very narrow) area of amorphous silicon that can be crystallized by the optimal high energy-density portion of the beam, instead of being crystallized near the crystallization threshold value over a wide region.

This is illustrated in FIG. 6C. Because of the truncated laser beam, the amorphous silicon area (606) can remain amorphous, while the area (608) where the laser beam is incident crystallizes, resulting in a high-quality crystallized area, e.g., with long grains, because the area had been irradiated by a truncated beam with energy density at the optimum (or near maximum) energy density level. According to aspects of the disclosure, a second knife edge can be used to remove the opposite tail of the gaussian waveform, to create an even better defined laser beam shape.

Figure 6D:
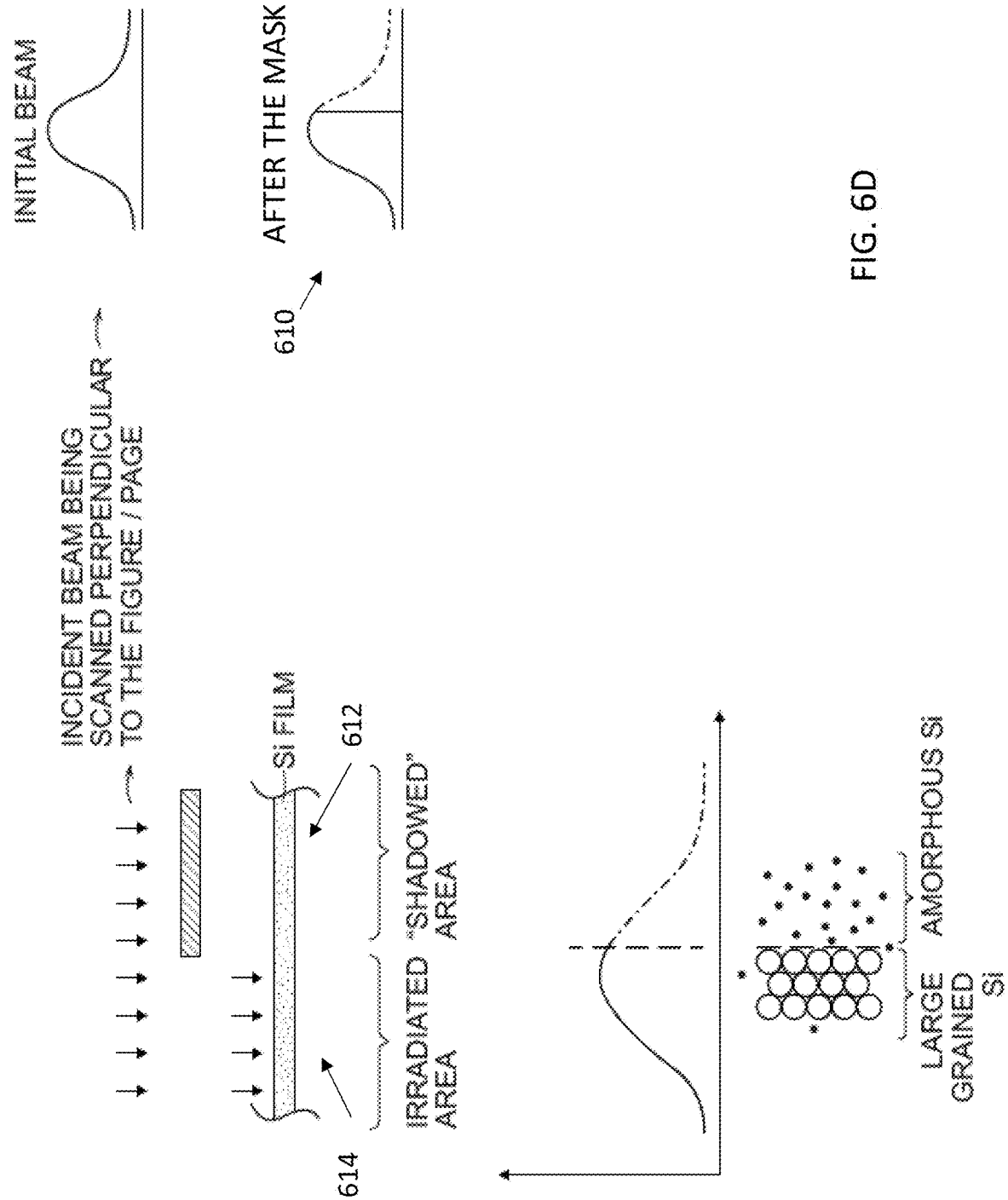

Aspects of the disclosed systems and methods are further illustrated in FIG. 6D. The incident beam is masked according to one of the methods discussed herein such that for each spot beam, an irradiated area and a shadowed area can be defined. FIG. 6D shows an exemplary effective waveform of the beam after the masking. As the shadowed beam is applied to the film, the shadowed area (612) receives an energy density that is below the crystallization threshold, while the irradiated area (614) receives a portion of the beam with high energy density, which results in a crystallization area that has large grains.

Figure 6E:
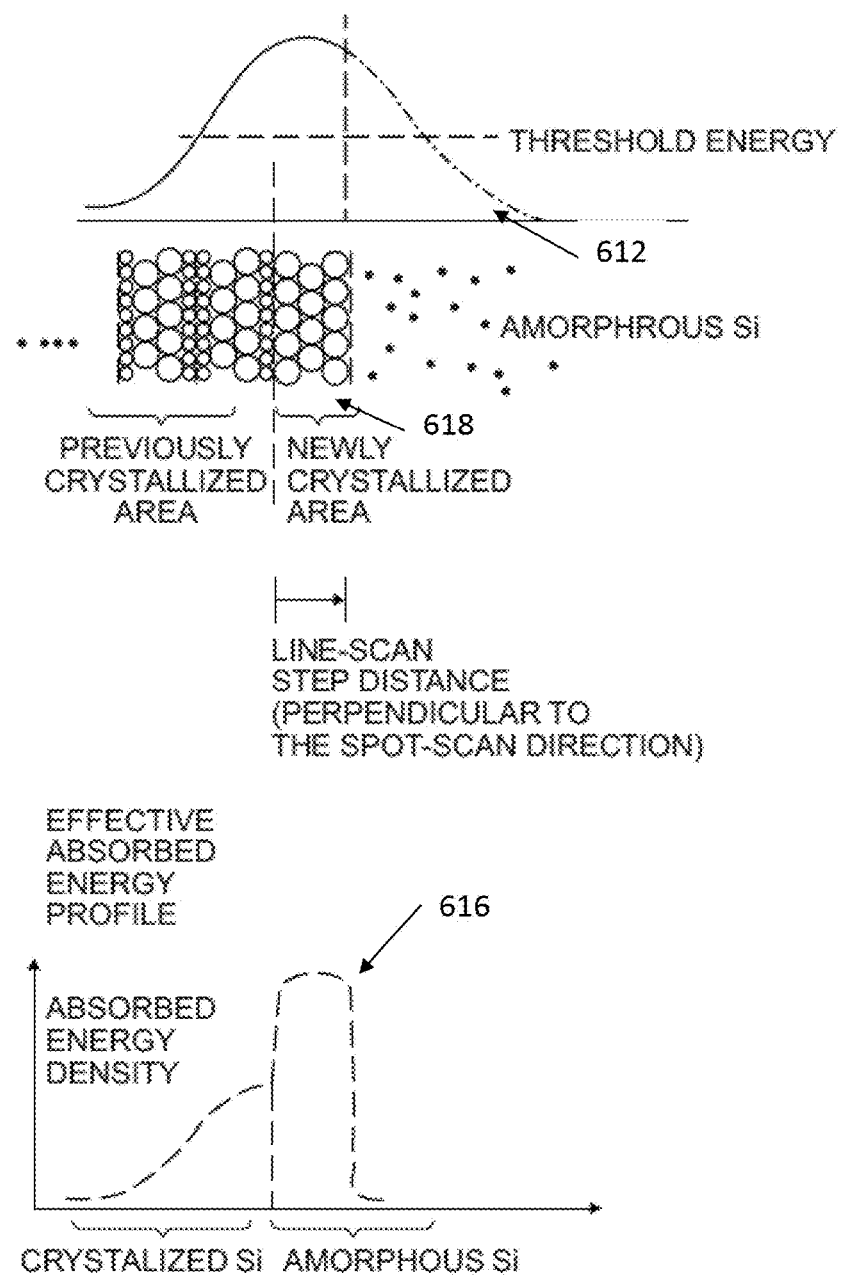

FIG. 6E shows the effect of successive irradiations of the shadowed beam of FIG. 6D. FIG. 6D shows that the beam moves for a line scan step along the scanning direction for every successive irradiation. Each new irradiation generates a newly crystalized area, while the mask ensures that the shadowed area (612) will remain amorphous, such that the next irradiation will be incident to an amorphous—and not crystallized—region. FIG. 6E also shows that the effective absorbed energy density (616) at the amorphous area that is newly crystallized (618) is high, relative to the affective absorbed energy density of the previously crystallized area.

Figure 7A:
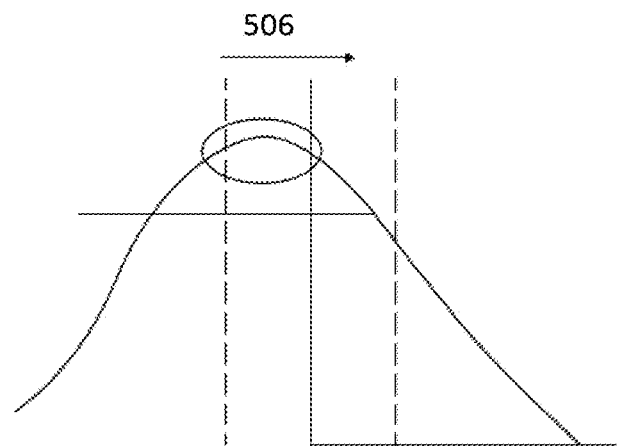
FIGS. 7A-7D illustrate an exemplary method for spot beam crystallization, according to aspects of the disclosure.
Figure 7B:
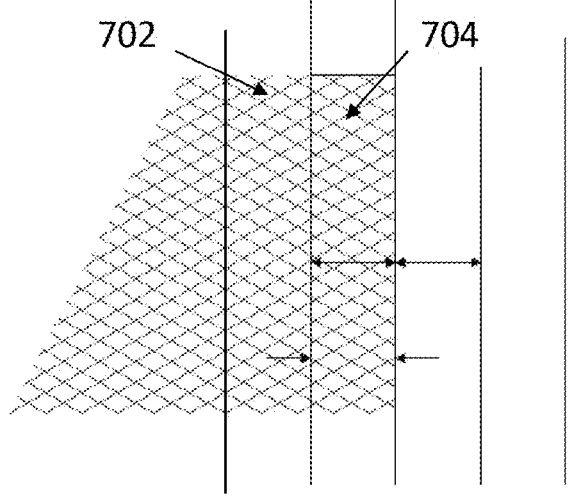
Figure 7C:
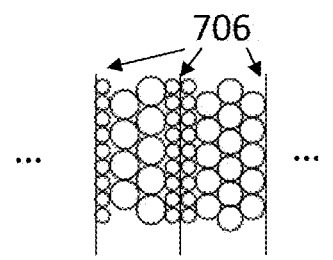

FIGS. 7A-7C show the resulting crystalized film after application of multiple beam spots on the thin film. As the beam moves across the scanning direction (506), only the area where the high intensity laser beam is incident crystallizes in a controlled manner. FIG. 7B shows the area (702) that is being crystalized by the spot beam, as well as the area (704) that will be irradiated next. This creates crystalized regions that are periodic and can be near-perfectly parallel, which is a desired feature for making uniform devices. As shown in FIG. 7C, the area on and around the boundaries (706) of the crystallized regions can locally contain small grain material (small crystals in a confined region), while the area away from the transition boundaries can contain uniform medium-to-large grain material (larger crystals over a wide area), because amorphous silicon crystallizes using high intensity. A person of ordinary skill would understand that this non-uniformity is not a problem, as long as the variation is precise and periodic, and smaller than the device size, or the variation happens at the locations where transistors are not fabricated, for example, at the boundary between the subpixels and pixels.

Figure 7D:
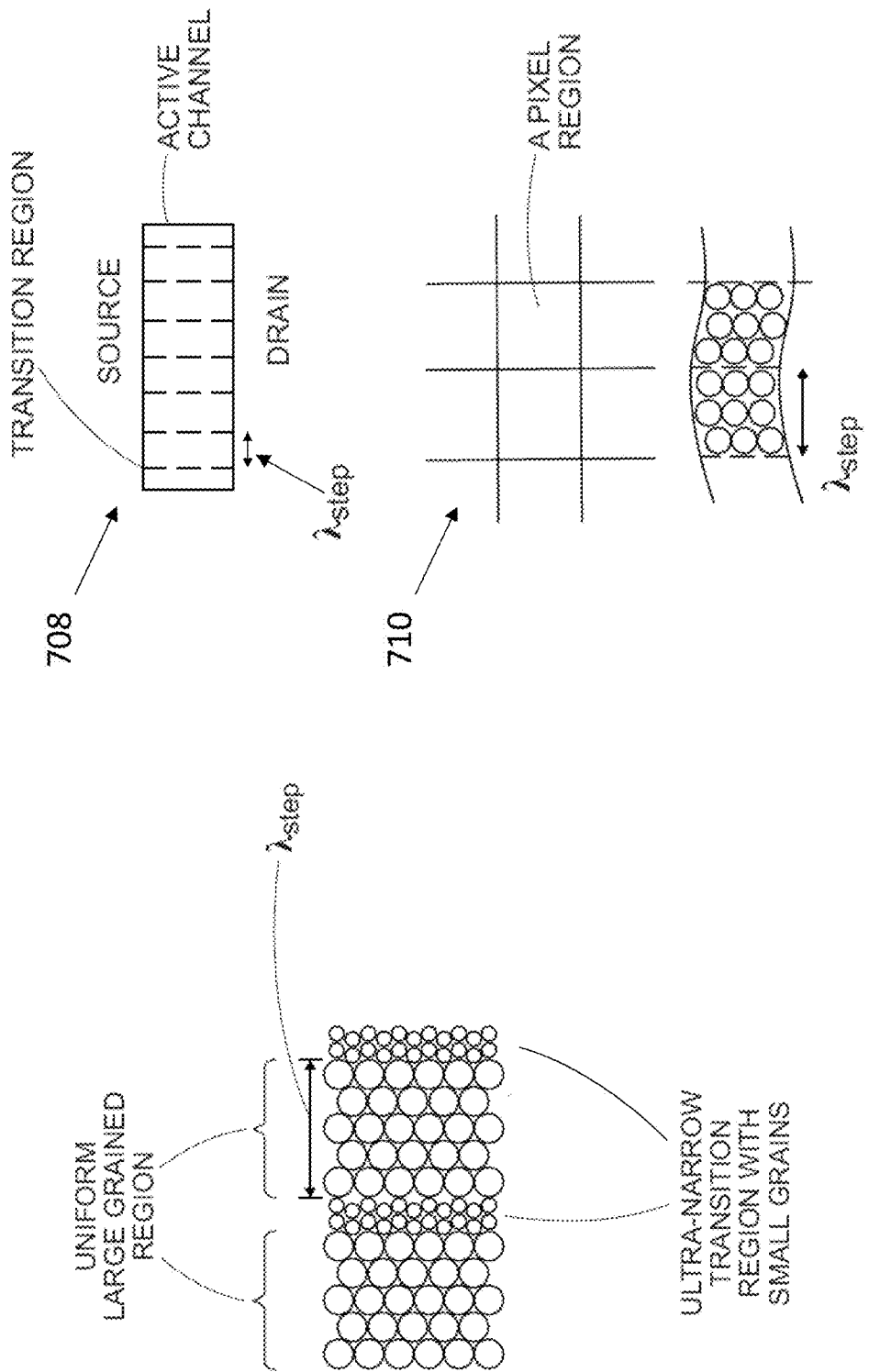

According to aspects of the disclosure, the disclosed systems and methods can produce crystallized films that have periodic uniform large-grained regions separated with ultra-narrow transition regions with small grains. This is illustrated in FIG. 7D, which shows uniform large grained regions with width approximately equal to the scan step λ being separated by the ultra-narrow crystalized films. This arrangement is very attractive for building transistors (708) where the active channel is made up from multiple uniform large-grained regions. This arrangement is also attractive for forming pixel regions (710) for LED or OLED displays.

According to aspects of the disclosure, the disclosed systems and methods use a mask that shapes the laser beam and can enable precise crystallization at high energy density that was not possible using conventional spot beam crystallization techniques. The disclosed systems and methods leverage the absorption difference for crystallized and amorphous silicon.

Figure 8:
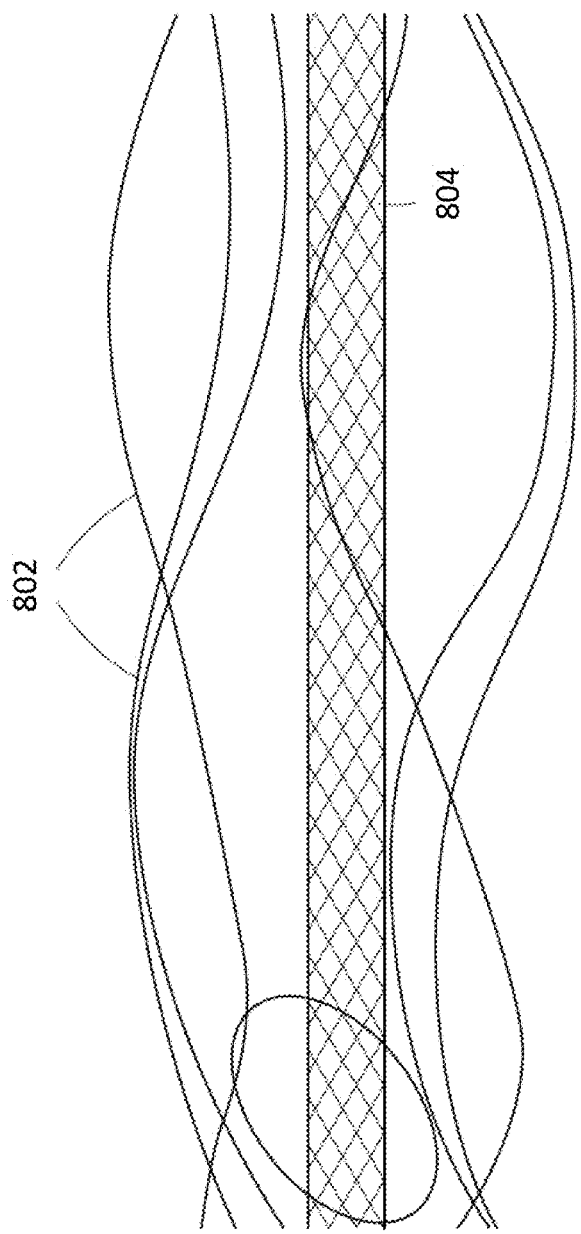
FIG. 8 illustrates an exemplary method for spot beam crystallization, according to aspects of the disclosure.

As discussed above, the beam can positionally fluctuate in location, e.g., move unsteadily from one side of the silicon to another, as shown in FIG. 8 generally at 802. The disclosed systems and methods can remedy this laser beam wobbling and instability, since the area that the laser is incident on is defined mostly by the knife edge, which is spatially decoupled with respect to the scanned spot beam, and the shape and location of which can be precisely controlled. Accordingly, the beam can wobble one way or the opposite way; however, the crystallized region (804) can have edges that are essentially straight lines and allow for precise control of the beam-exposed amorphous region and resulting microstructure using currently available lasers and existing imperfect systems.

According to aspects of the disclosure, the output of two lasers can be combined to form the laser beam. This can reduce variability, for example, if one laser is used and exhibited variability in the energy density of the beams for irradiation of subsequent regions. According to aspects of the invention, two sets of two lasers can be used to irradiate the thin film. For example, the first set can combine the output of two lasers to form the beam for irradiating one region of the film, and the second set can combine the output of two other lasers to form the beam for irradiating a neighboring region of the film. According to aspects of the disclosure, the two sets can alternate, such that one set is used right after the other to generate the spot beams.

According to aspects of the disclosure, the knife edge can have different shapes. For example, the knife edge can be straight or have a sawtooth (or other non-straight) pattern.

Figure 9:
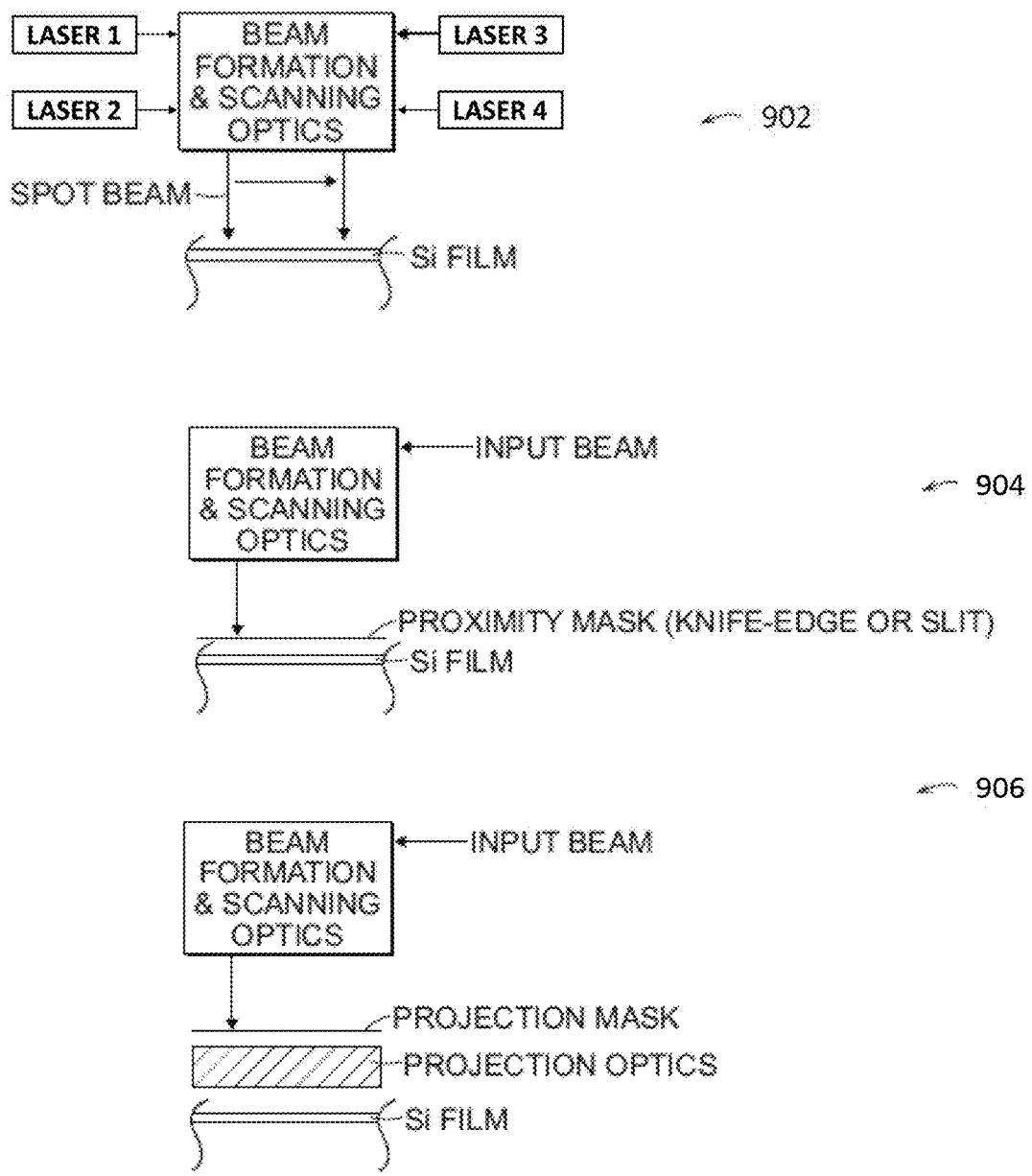
FIG. 9 illustrates an exemplary method for spot beam crystallization, according to aspects of the disclosure.

According to aspects of the disclosure, the disclosed systems and methods use a shaped beam, for example, sharply truncated spot beam by using a knife-edge-type mask (either proximity or projection-type). This is illustrated in FIG. 9. Specifically, FIG. 9 shows an exemplary spot beam crystallization technique (902) where an input beam is formed through beam formation and/or scanning optics, such that a spot beam it is incident on a silicon film. According to aspects of the disclosure, a proximity mask, for example, a knife edge or a slit, can be used to shape the incident spot beam to the film (904). According to aspects of the disclosure, a projection mask (and projection optics) can be used to shape the incident spot beam to the film (906).

A person of ordinary skill would understand that the examples using green laser above are not limiting, and that other lasers can be used, for example, ultra-violet (UV) lasers. A person of ordinary skill would also understand that the examples using a gaussian-shaped laser beam are not limiting, and that other laser profiles can be used, for example, profile that crystallization happens at optimal (near-maximum) energy density, while the beam is blocked in a way to prevent crystallization by minimum energy densities. A person of ordinary skill would also understand that the examples using a quasi continuous-wave laser are not limiting, and that other laser types can be used, for example, continuous-wave and or/pulsed lasers.

According to aspects of the disclosure, a system for crystallizing a thin film can include a computer-controlled stage configured to hold a thin film, an optics system configured to produce a laser spot beam directed towards the thin film, and continually translate a truncated laser spot beam in a first direction while irradiating an amorphous silicon area of the thin film to generate a molten zone in the irradiated amorphous silicon area, and a mask configured to truncate the laser spot beam before the laser spot beam comes into contact with the thin film.

The invention claimed is:

1. A method for crystallizing a thin film, the method comprising steps of:
   providing a thin film;
   providing an optics system including at least one laser, the at least one laser configured to produce a laser spot beam directed towards the thin film;
   truncating, by the optics system, the laser spot beam with a knife edge before the laser spot beam comes into contact with the thin film, wherein the knife edge is spatially decoupled from the laser spot beam;
   continually translating, by the optics system, the truncated laser spot beam in a first direction while irradiating an amorphous silicon area of the thin film to generate a molten zone in the irradiated amorphous silicon area; and
   allowing the irradiated amorphous silicon area to cool and solidify,
   wherein truncating the laser spot beam comprises using the knife edge to provide a proximity mask that reduces energy density of the laser spot beam.

2. The method of claim 1, wherein the step of truncating the laser spot beam results in blocking a portion of the laser spot beam with energy density values substantially close to a crystallization threshold value of amorphous silicon.

3. The method of claim 1, wherein the optics system comprises at least one of a constant frequency laser, a continuous-wave solid-state laser, a quasi-continuous wave solid-state laser, a pulsed laser, or a fiber laser.

4. The method of claim 3, wherein a wavelength of the laser is in the Ultra Violet (UV) spectrum or the visible spectrum.

5. The method of claim 4, wherein the laser is a green laser or a blue laser.

6. The method of claim 1, wherein an energy density profile of the laser spot beam in at least one direction is a Gaussian profile and truncating the laser spot beam results in modifying the Gaussian profile.

7. The method of claim 1, wherein the optics system comprises a laser configured to direct a beam towards a rotating scanning mirror to generate a reflected beam towards the thin film.

8. The method of claim 1, wherein the optics system comprises two lasers and is configured to combine a first output of a first one of the two lasers and a second output of a second one of the two lasers to produce the laser spot beam.

9. The method of claim 8, wherein the first output and the second output are combined to simultaneously fire shots or sequentially fire shots, wherein the sequentially firing results in partially overlapping shots or fully separated shots.

10. The method of claim 1, wherein the optics system comprises four lasers and is configured to combine outputs of a first laser and a second laser to produce the laser spot beam for irradiating a first region of the thin film and to combine outputs of a third laser and a fourth laser to produce a second laser spot beam for irradiating a second region of the thin film.

11. The method of claim 10, wherein the optics system is configured to alternate between combining outputs of the first laser and the second laser to produce the laser spot beam for irradiating a first region of the thin film and combining outputs of the third laser and the fourth laser to produce a second laser spot beam for irradiating a second region of the thin film, the second region neighboring the first region.

12. A method for crystallizing a thin film, the method comprising steps of:
providing a thin film;
providing an optics system including at least one laser, the at least one laser configured to produce a laser spot beam directed towards the thin film;
truncating, by the optics system, the laser spot beam with a knife edge before the laser spot beam comes into contact with the thin film, wherein the knife edge is spatially decoupled from the laser spot beam;
continually translating, by the optics system, the truncated laser spot beam in a first direction while irradiating an amorphous silicon area of the thin film to generate a molten zone in the irradiated amorphous silicon area; and
allowing the irradiated amorphous silicon area to cool and solidify, wherein
truncating the laser spot beam comprises using the knife edge to provide a projection mask and using projection optics that block a portion of the laser spot beam with energy density values substantially close to a crystallization threshold value of amorphous silicon.

13. The method of claim 12, wherein the optics system comprises at least one of a constant frequency laser, a continuous-wave solid-state laser, a quasi-continuous wave solid-state laser, a pulsed laser, or a fiber laser.

14. The method of claim 13, wherein a wavelength of the laser is in the Ultra Violet (UV) spectrum or the visible spectrum.

15. The method of claim 14, wherein the laser is a green laser or a blue laser.

16. The method of claim 12, wherein an energy density profile of the laser spot beam in at least one direction is a Gaussian profile and truncating the laser spot beam results in modifying the Gaussian profile.

17. The method of claim 12, wherein the optics system comprises a laser configured to direct a beam towards a rotating scanning mirror to generate a reflected beam towards the thin film.

18. The method of claim 12, wherein the optics system comprises two lasers and is configured to combine a first output of a first one of the two lasers and a second output of a second one of the two lasers to produce the laser spot beam.

19. The method of claim 18, wherein the first output and the second output are combined to simultaneously fire shots or sequentially fire shots, wherein the sequentially firing results in partially overlapping shots or fully separated shots.

20. The method of claim 12, wherein the optics system comprises four lasers and is configured to combine outputs of a first laser and a second laser to produce the laser spot beam for irradiating a first region of the thin film and to combine outputs of a third laser and a fourth laser to produce a second laser spot beam for irradiating a second region of the thin film.

* * * * *